United States Patent [19]

Numano et al.

[11] Patent Number: 4,889,983
[45] Date of Patent: Dec. 26, 1989

[54] IMAGE SENSOR AND PRODUCTION METHOD THEREOF

[75] Inventors: Yoshinori Numano; Masahiro Hayama, both of Amagasaki, Japan

[73] Assignee: Mitsubishi Denki Kabushiki Kaisha, Japan

[21] Appl. No.: 275,104

[22] Filed: Nov. 22, 1988

[30] Foreign Application Priority Data

Nov. 24, 1987 [JP] Japan ............................ 62-295852
Mar. 4, 1988 [JP] Japan ............................ 63-52222

[51] Int. Cl.$^4$ ............................................. H01J 40/14
[52] U.S. Cl. ................................. 250/211 J; 250/578; 357/2
[58] Field of Search ................ 250/211 R, 211 J, 578; 357/2, 30 K, 24 LR

[56] References Cited

U.S. PATENT DOCUMENTS 4,763,010 8/1988 Fukaya et al. ...................... 250/578
4,823,178 4/1989 Suda ....................................... 357/2

Primary Examiner—David C. Nelms
Attorney, Agent, or Firm—Leydig, Voit & Mayer

[57] ABSTRACT

An image sensor includes an amorphous silicon photodiode on an insulating substrate, an amorphous silicon thin film transistor disposed on the same substrate for reading out charges stored by said photodiode, and a wiring film as a source/drain electrode of said transistor and as a first electrode of the photodiode free of steps. The image sensor may include a matrix wiring section for taking out signals, a silicon film including a channel protection film for the transistor, an insulating film for the matrix wiring, and a second conductor of the matrix wiring connected with the source/drain electrode of the transistor and arranged in a direction generally normal to the source/drain electrode and disposed on the wiring film.

33 Claims, 6 Drawing Sheets

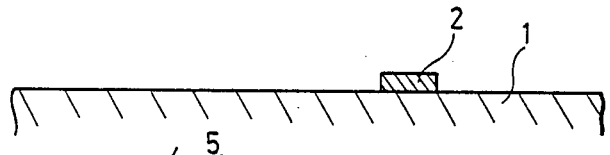
FIG. 2 (a)
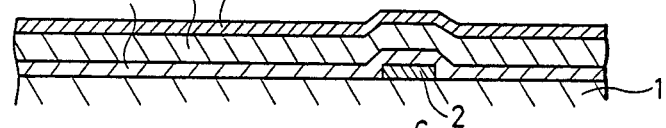
FIG. 2 (b)
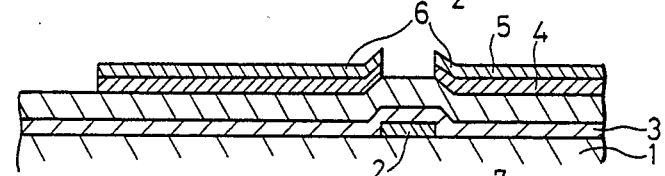
FIG. 2 (c)
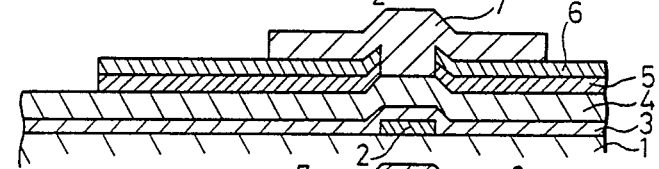
FIG. 2 (d)
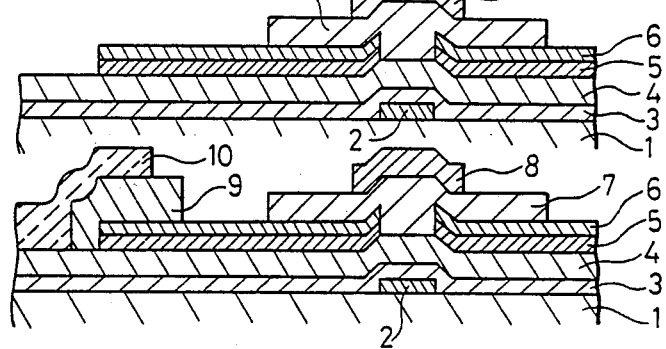
FIG. 2 (e)
FIG. 2 (f)

IMAGE SENSOR AND PRODUCTION METHOD THEREOF

FIELD OF THE INVENTION

The present invention relates to an image sensor, and more particularly to one in which an amorphous silicon photodiode (hereinafter referred to as a-Si PD) and an amorphous silicon thin film transistor (hereinafter referred to as a-Si TFT) for reading out charges stored at the photodiode are integrated on an insulating substrate, or one in which an a-Si PD, an a-Si TFT and matrix wiring are integrated on an insulating substrate, and methods of producing such image sensors.

BACKGROUND OF THE INVENTION

FIG. 5 shows a cross-sectional view of a prior art image sensor (line sensor) in which a-Si PD and a-Si TFT are integrated on a substrate, disclosed in Japanese Laid-open Patent Publication No. 61-89661. In FIG. 5, a gate electrode 2 is disposed on a desired portion of an insulating substrate 1, and a gate insulating film 3 is disposed on the remainder of substrate 1 and on film 3. An undoped a-Si film as an active layer 4 is disposed on a portion of the gate insulating film 3 to cover the gate electrode 2. A P (phosphorus) doped n+-a-Si film 5 is disposed on the active layer 4 as a source/drain electrode in an ohmic contact with the active layer 4, and a source/drain electrode 6 is disposed thereon. A channel protection film 7a is disposed in a hollow section of the source/drain electrode 6, and a TFT protection film 7b is disposed thereon. Thus, a-Si TFT 30 for reading out charges stored at a photodiode is constituted by elements 2, 3, 4, 5, 6, 7a and 7b. An undoped a-Si film 9 which constitutes a photodiode is disposed on another portion of the gate insulating film 3, and an electrode material 11b is provided thereon. Reference numeral 10 designates a transparent electrode. Thus, a-Si PD 20 is constituted by elements 9, 10, and 11b. An electrode material 11a is provided for connecting the a-Si PD 20 with the a-Si TFT 30.

The operation of this image sensor is well known. That is, an incident light is converted into an electrical signal by a-Si PD 20 constituted by the electrode material 11b, the a-Si film 9, and the transparent electrode 10, and the electric signal is read out by turning on the gate electrode 2 of TFT.

In the prior art image sensor described above, since the a-Si PD 20 and the a-Si TFT 30 are separately produced, the electrode material 11a is provided for connecting the a-Si PD 20 and the a-Si TFT 30. Therefore, a contact defect may occur at the contact surface of the electrode material 11a and the transparent electrode 10 or a contact surface of the electrode material 11a and the source/drain electrode 6 due to for example, an oxide which is generated in the transparent electrode 10 or in the source/drain electrode 6 furthermore, electrode material 11a may be broken due to the difference in levels of the source/drain electrode 6, the n+-a-Si film 5, and the undoped a-Si film 4. Accordingly, the connection defect may occur between the a-Si PD 20 and the a-Si TFT 30, thereby resulting in unstable operating characteristics and a reduction in the yield.

FIG. 6 shows a cross-sectional view of another prior art image sensor in which a-Si PD, a-Si TFT, and matrix wiring for taking signals to the outside are integrated on an insulating substrate, disclosed in "A Technical Report of Institute of Electronics and Communication Engineers ED 83-72 (1983)". In FIG. 6, the same reference numerals designate the same elements as those shown in FIG. 5. Reference numerals 3a and 3b designate a gate insulating film and an inter-wiring insulating film, respectively. A channel protection film 7 is provided for protecting the channel region. A second conductor 8 of matrix wiring section 40 is connected with the source/drain electrode 6 of a-Si TFT through a portion of electrode 6 that is arranged in a direction generally normal to the source/drain electrode.

The operation of this image sensor will be described with reference to FIG. 7. FIG. 7 shows an equivalent circuit diagram of an image sensor of FIG. 6. An incident light is converted into an electric signal in the undoped a-Si film 9, and the electric signal is stored in a floating capacitor between PD and TFT. Next, the gate line G1 is turned on, and the other gate lines are turned off. The electric signals which are obtained by light-electricity conversion and stored at photodiodes $PD_{1,1}$ to photodiodes $PD_{1,64}$ are transferred to load capacitors $C_1$ to $C_{64}$ through transistors $T_{1,1}$ to $T_{1,64}$. After turning off the gate line G1, the stored electric charges are read out as an output signal by the scanning of the data lines $D_1$ to $D_{64}$ by an external circuit. Thereafter, the load capacitors $C_1$ to $C_{64}$ are initialized by a reset signal, and the gate line G2 is turned on, and the electric signals which are obtained by light-electricity conversion at photodiodes $PD_{2,1}$ to $PD_{2,64}$ are transferred to the load capacitors $C_1$ to $C_{64}$. By repeating the above-described operation 27 times, the information for one line (1728 bits/line, 8 dots/mm) can be read out. Thus, the device shown in FIG. 6 operates as an image sensor.

In the prior art image sensor described above, the gate electrode 2 and the second conductor 8 are produced in the same process step. In this case, since the gate insulating film 3a of the a-Si TFT and the inter-wiring insulating film 3b of the matrix wiring section are required to have different thicknesses, these films 3a and 3b are respectively produced by different process steps. Furthermore, since the second conductor 8 is wired below the source/drain electrode 6, the undoped a-Si film 4 and the n+-a-Si film 5 cannot be left in the area of the matrix wiring section in order to achieve good coverage by the electrode 6. Therefore, the source/drain electrode 6 is likely to be broken at the changes in levels of the undoped a-Si film 4 and the n+-a-Si film 5, thereby resulting in reduction in the yield. Furthermore, at least two process steps are required between the production of the second conductor 8 and the production of the source/drain electrode 6, and therefore an oxide film is likely to form on the second conductor 8 and connection defects are likely to occur between the second conductor 8 and the source/drain electrode 6, thereby resulting in variation in the device characteristics.

SUMMARY OF THE INVENTION

An object of the present invention is to provide an improved image sensor having high stability.

Another object of the present invention is to provide a method for producing such an image sensor in a simple process and at high yield.

Other object and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to an aspect of the present invention, a wiring film is provided as a source/drain electrode of an a-Si TFT and as a lower electrode of an a-Si PD, and the a-Si PD is directly produced on one end of the wiring film.

According to another aspect of the present invention, silicon films which are produced as an active layer and an ohmic contact layer of the a-Si TFT remain under the source/drain electrode, a channel protection film of the a-Si TFT is produced as an inter-wiring insulating film of a matrix wiring section, and a shading film for preventing light from entering into the channel region of the a-Si TFT and a second conductor of the matrix wiring are produced from the same material at the same time.

BRIEF DESCRIPTION OF THE DRAWINGS

FIGS. 2(a), 2(b), 2(c), 2(d), 2(e) and 2(f) are diagrams showing a production method of the image sensor of FIG. 1;

DETAILED DESCRIPTION OF THE PREFERRED EMBODIMENT

An embodiment of the present invention will be described in detail with reference to the drawings.

Figure 1:
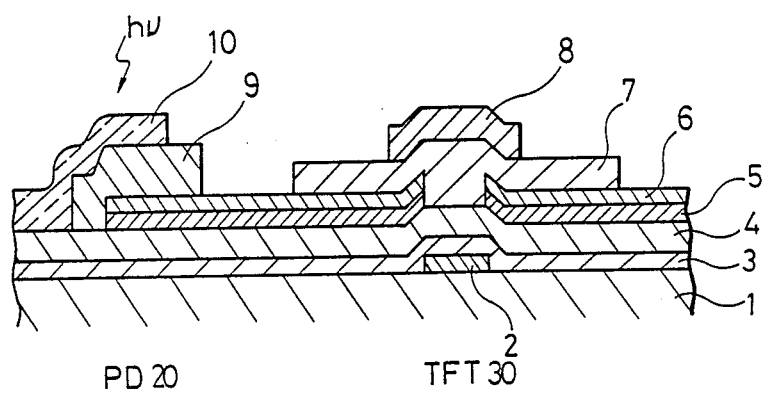
FIG. 1 is a diagram showing a cross-sectional view of an image sensor according to an embodiment of the present invention.

FIG. 1 is a cross-sectional view showing an image sensor according to an embodiment of the present invention. In FIG. 1, a gate electrode 2 comprising, for example, CL, is disposed on a desired portion of an insulating substrate 1 comprising, for example, glass. A gate insulating film 3 comprising, for example, $Si_3N_4$, is disposed on the remainder of the surface of the substrate 1 and on film 3. An undoped a-Si film as an active layer 4 is disposed on the entire surface of the gate insulating film 3. A P doped $n^+$-a-Si film 5 is disposed on the active layer 4, except opposite gate electrode 2, for making a source drain electrode in an ohmic contact with the active layer 4, and a source/drain electrode 6 comprising, for example, Cr, is disposed thereon. A channel protection film 7 comprising, for example, $Si_3N_4$, is disposed on the source/drain electrode 6, and a shading film 8 comprising, for example, Al, is provided thereon for preventing light from entering the channel region. Thus, an a-Si TFT 30 for reading out charges stored at a photodiode is constituted by elements 2, 3, 4, 5, 6, 7 and 8. An a-Si film 9 comprising, for example, undoped a-Si, is disposed on the other end of the source/drain electrode 6, and a transparent electrode 10 comprising, for example, indium tin oxide (ITO), is disposed thereon. Thus, an a-Si PD 20 is constituted by elements 6, 9 and 10.

The production of the image sensor of FIG. 1 will be described with reference to FIGS. 2(a) to 2(f). In FIGS. 2(a) to 2(f), the same reference numerals designate the same elements as those shown in FIG. 1.

First, an a-Si TFT 30 is produced.

The gate electrode 2 of a-Si TFT is deposited on the insulating substrate 1 (FIG. 2(a)). Next, the gate insulating film 3, the undoped a-Si film 4, and the $n^+$-a-Si film 5 are successively deposited on the insulating substrate 1 by an RF plasma CVD method (FIG. 2(b)). Next, portions of the undoped a-Si film 4 and the $n^+$-a-Si film 5 other than the portions which constitute a-Si TFT are removed by etching. The source/drain metal layer is deposited on the entire surface of substrate 1 by a vacuum evaporation method and selectivity etched to produce the source/drain electrode 6 of a-Si TFT and a lower electrode of a-Si PD (FIG. 2(c)). Thereafter, a portion of the $n^+$-a-Si film corresponding to a channel region of a-Si TFT is removed by etching, and the channel protection film 7 is produced thereon (FIG. 2(d)). Furthermore, the shading film 8 is deposited to prevent light from entering into the channel region of a-Si TFT (FIG. 2(e)).

Thereafter, a-Si PD 20 is produced.

Since the lower electrode of a-Si PD was already produced at the production of the source/drain electrode 6 of a-Si TFT, the process step for producing this lower electrode can be omitted. The a-Si film 9 which constitutes a photodiode is deposited by an RF plasma CVD method and the transparent electrode 10 which, forms a Schottky barrier at the junction with the a-Si film 9 and guides light into the a-Si film 9 is desposited thereon (FIG. 2(f)).

In this embodiment, since a wiring film is produced as the source/drain electrode of a-Si TFT as well as the lower electrode of a-Si PD, the production process can be simplified, and the breakage of wiring due to the inter-wiring step can be prevented. Furthermore, since the material for the electrode between the a-Si TFT and the a-Si PD which had existed in the prior art device can be omitted, formation of an oxide film and connection defects are prevented, thereby enabling productions at high yield.

Figure 3:
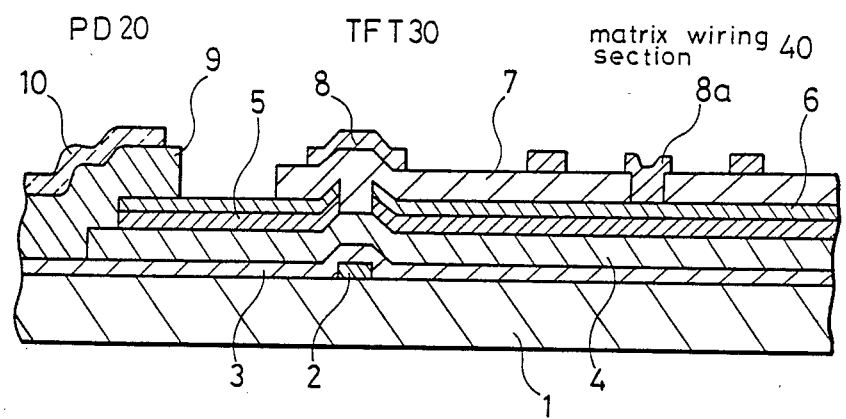
FIG. 3 is a diagram showing a cross-sectional view of an image sensor according to another embodiment of the present invention.

FIG. 3 shows a cross-sectional view of an image sensor according to another embodiment of the present invention. In FIG. 3, the same reference numerals designate the same elements as those shown in FIG. 1. In FIG. 3, reference numeral 8a designates a second conductor of a matrix wiring section 40 comprising, for example, Al. Second conductor 8a is connected with the source/drain electrode 6 of a-Si TFT through a portion arranged in a direction generally normal to the source/drain electrode 6.

FIGS. 4(a) to 4(f) show a production method of the image sensor of FIG. 3. In FIGS. 4(a) to 4(f), the same reference numerals designate the same elements as those shown in FIG. 3.

Figure 4:
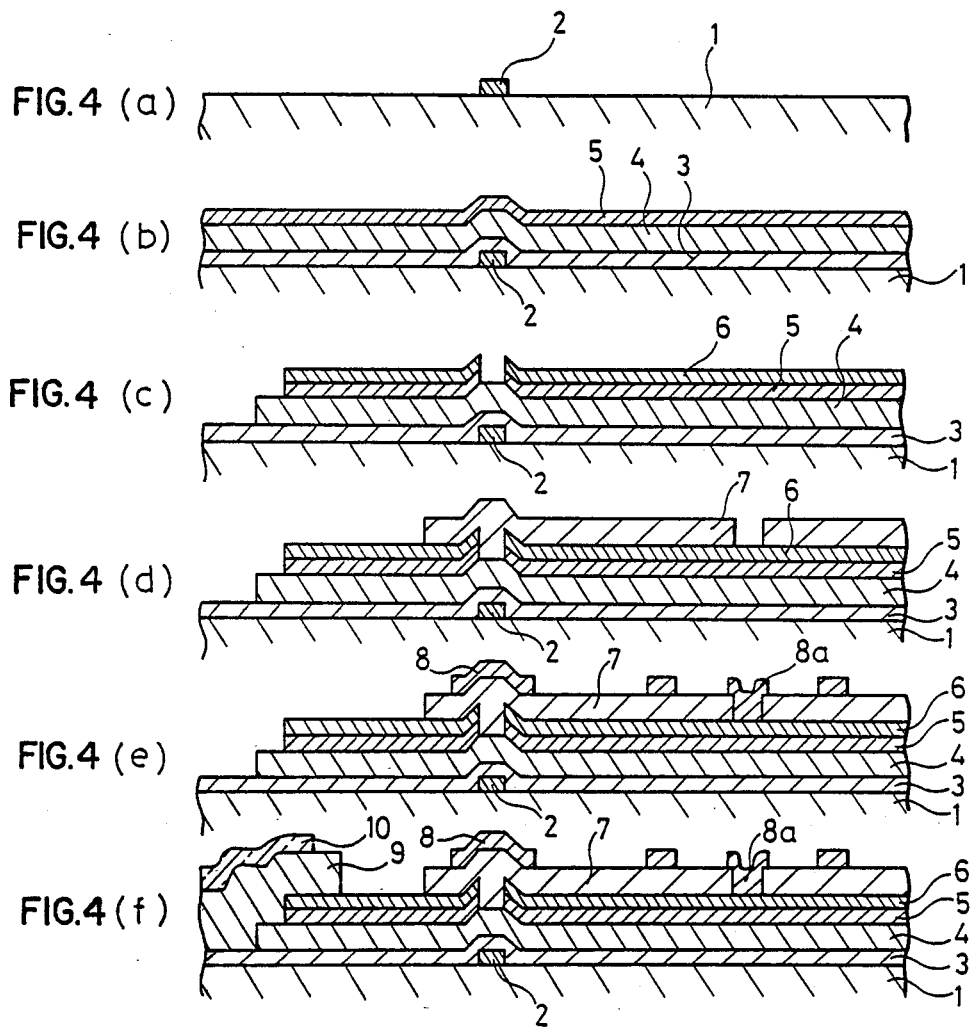
FIGS. 4(a), 4(b), 4(c), 4(d), 4(e) and 4(f) are diagrams showing a production method of the image sensor of FIG. 3.
Figure 5:
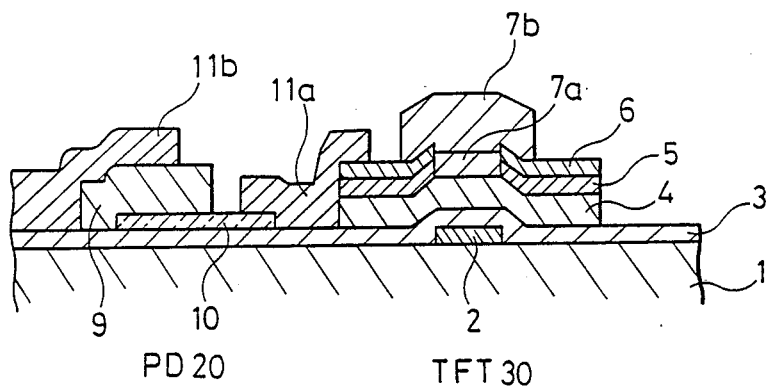
FIG. 5 is a diagram showing a cross-sectional view of an image sensor according to the prior art.
Figure 6:
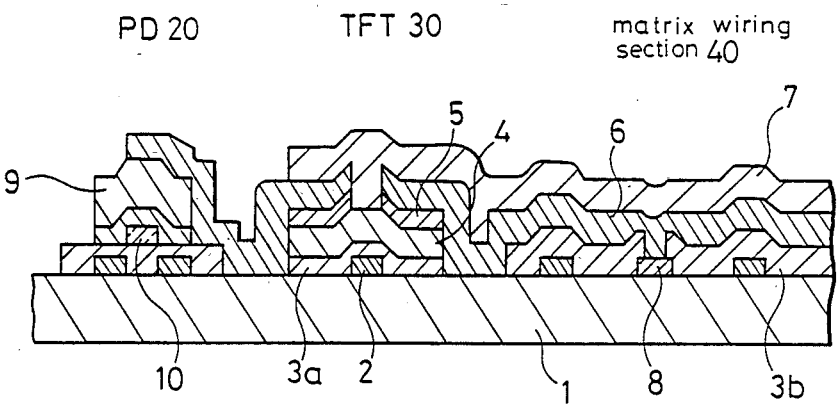
FIG. 6 is a diagram showing a cross-sectional view of an image sensor according to the prior art.
Figure 7:
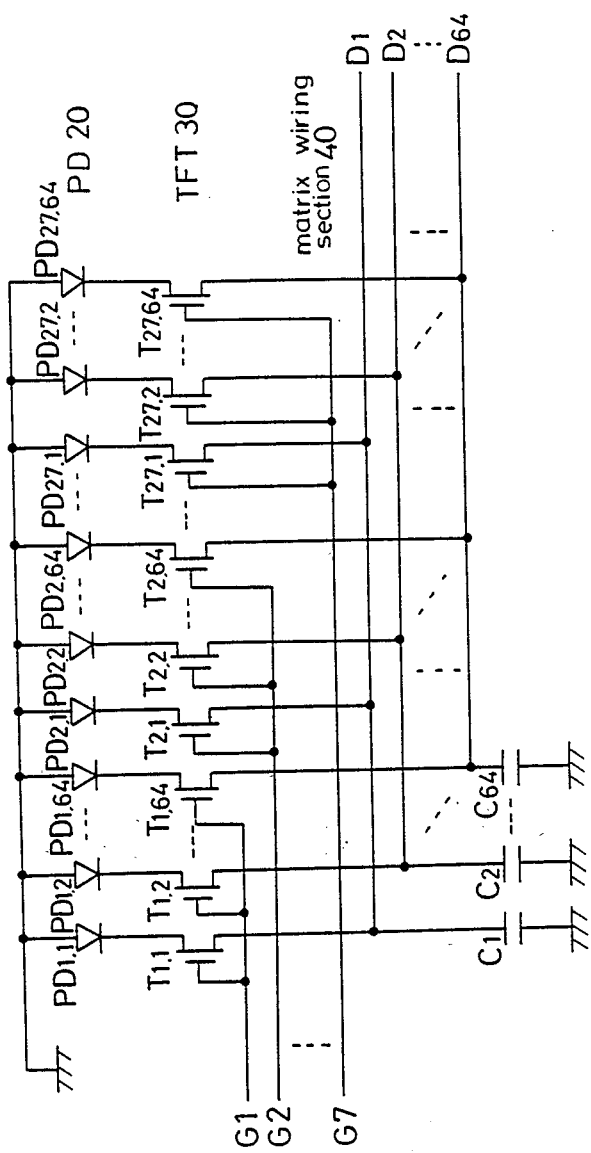
FIG. 7 is a diagram showing an equivalent circuit of the image sensor of FIG. 6.

In the production of a-Si TFT 30, the gate electrode 2 is deposited on the insulating substrate 1 FIG. 4(a)). The gate insulating film 3, the undoped a-Si film 4, and the P doped $n^+$-a-Si film 5 are successively deposited thereon by an RF plasma CVD method (FIG. 4(b)). Next, portions of the undoped a-Si film 4 nd the $n^+$-a-Si film 5, other than portions which constitute the a-Si TFT, are removed by etching. Then, a source/drain metal layer is deposited thereon by a vacuum evaporation method and etched to produce a source/drain electrode 6 of a-Si TFT and a lower electrode of a-Si PD at the same time (FIG. 4(c)). Thereafter, a portion of the n+-a-Si film 5 corresponding to a channel region of a-Si TFT is removed by etching. The channel protection film 7 which also functions as an interwiring insulating film for insulating the source/drain electrode 6 from the second conductor 8a is deposited thereon (FIG. 4(d)): Furthermore, the shading film 8 for preventing light from entering into the channel region of a-Si TFT and the second conductor 8a of the matrix wiring section 40 are produced from the same material at the same time (FIG. 4(e)).

In the production process of a-Si PD 20, a lower electrode of a-Si PD is already produced in the deposition of the source/drain electrode 6 of a-Si TFT. The a-Si film 9 which will constitute a photodiode is produced by an RF plasma CVD method, and the transparent electrode 10 which forms a Schottky barrier at the junction with the a-Si film 9 and guides light into the a-Si film 9 is deposited thereon (FIG. 4(f)).

In this second embodiment, the coverage defects in source/drain electrode 6 due to a step between the undoped a-Si film 4 and the n+-a-Si film 5 are prevented. Furthermore, because only one process step for depositing the channel protection film 7 is required between the deposition of the source/drain electrode 6 and the deposition of the second conductor 8a, the formation of an oxide on the source/drain electrode 6 is reduced to the minimum possible, thereby obtaining an image sensor having a high stability.

While in the above-illustrated first and second embodiments an a-Si PD comprising a single undoped a-Si layer is described, the present invention can be also applied to an a-Si PD in which boron doped a-Si (p+-a-Si), undoped a-Si, and P doped a-Si (n+-a-Si) are successively deposited in the above-mentioned order or in the order reverse thereto, or in which p+-a-Si and undoped a-Si, or undoped a-Si and n+ a-Si are successively deposited in the abovementioned order or in the order reverse thereto, respectively.

While in the above illustrated first and second embodiments an a-Si PD is described, the present invention can be also applied to a PD of a-SiC or a-SiGe.

In the above-illustrated first and second embodiments a-Si film is employed as the active layer 4 of a-Si TFT, but the active layer 4 can be made of polycrystalline Si with the same effects as described above.

While in the above-illustrated second embodiment $Si_3N_4$ is employed for the channel protection film 7, the channel protection film 7 can be made of $SiO_2$ with the same effects as described above.

Furthermore, in the above-illustrated second embodiment Al is employed for the second conductor 8a and Cr is employed for the source/drain electrode 6, but the second conductor 8a can be made of, for example, Cr, Ta, Ti or Mo and the source/drain electrode 6 can be made of, for example, Ta, Ti or Mo, respectively.

As is evident from the foregoing description, according to the present invention, a wiring film is provided as a source/drain electrode of a-Si TFT at one portion of the device and as one electrode of a-Si PD at another portion. The a-Si PD is directly deposited on the wiring film. Therefore, the production process can be simplified, and connection defects which may occur between the a-Si PD and the a-Si TFT can be prevented. Thus, an image sensor having high stability can be produced at high yield.

According to another aspect of the present invention, the undoped a-Si film and the n+-a-Si film remain under the source/drain electrode of a-Si TFT. The channel protection film also functions as an inter-wiring insulating film. The second conductor and the shading film are produced from the same material at the same time. Therefore, the production process can be simplified, coverage defects of the source/drain electrode are reduced, and these result in a high yield. Furthermore, because only one process step for producing the channel protection film is required between the production of the source/drain electrode and the production of the second conductor, formation of an oxide film on the source/drain electrode can be reduced to the minimum possible. This results in an image sensor with a high stability that can be produced at low cost.

What is claimed is:

1. An image sensor comprising:
   an amorphous silicon photodiode disposed on an insulating substrate;
   an amorphous silicon thin film transistor disposed on said insulating substrate for reading out charges stored by said photodiode; and
   a wiring film forming both a source/drain electrode of said transistor and a first electrode of said photodiode free of steps.

2. An image sensor as defined in claim 1 wherein said photodiode comprises an amorphous silicon film disposed on said first electrode, a transparent electrode disposed on said amorphous silicon film, and said first electrode.

3. An image sensor as defined in claim 1 wherein said transistor comprises an active layer constituting a channel region of said transistor, a gate electrode disposed on said insulating substrate, a gate insulating film interposed between said active layer and said gate electrode, and an ohmic contact layer and said source/drain electrode successively deposited on said active layer opposite said gate insulating film at opposite sides of said gate electrode.

4. An image sensor as defined in claim 1 wherein said insulating substrate comprises glass.

5. An image sensor as defined in claim 1, wherein said wiring film comprises, chromium.

6. An image sensor as defined in claim 2 wherein said transparent electrode comprises indium tin oxide.

7. An image sensor as defined in claim 3 wherein said gate electrode comprises chromium.

8. An image sensor as defined in claim 3 wherein said gate insulating film comprises $Si_3N_4$.

9. An image sensor as defined in claim 3 wherein said active layer comprises undoped amorphous silicon.

10. An image sensor as defined in claim 3 wherein said ohmic contact layer comprises phosphorus doped n+ type amorphous silicon.

11. An image sensor as defined in claim 3 wherein said transistor comprises a channel protection film disposed opposite said gate on said active layer comprising $Si_3N_4$.

12. An image sensor as defined in claim 3 wherein said transistor comprises a shading film of Al disposed opposite said gate for preventing light from entering said channel region.

13. An image sensor comprising:
   an amorphous silicon photodiode disposed on an insulating substrate;

an amorphous silicon thin film transistor disposed on said insulating substrate for reading out charges stored by said photodiode; and a matrix wiring for reading out signals from said photodiode;

a wiring film forming both a source/drain electrode of said transistor and a first electrode of said photodiode free of steps; and a film including silicon disposed on said transistor and including a channel protection film for said transistor and for insulating film said matrix wiring, said matrix wiring including a second conductor connected to said source/drain electrode of said transistor and including a portion disposed generally normal to said source/drain electrode and disposed on said wiring film.

14. An image sensor as defined in claim 13 wherein said photodiode comprises an amorphous silicon film disposed on said first electrode, a transparent electrode disposed on said amorphous silicon film and said first electrode.

15. An image sensor as defined in claim 13 wherein said transistor comprises an active layer constituting a channel region of said transistor, a gate electrode disposed on said insulating substrate, a gate insulating film interposed between said active layer and said gate electrode, and an ohmic contact layer and said source/drain electrode successively deposited on said active layer opposite said gate insulating film at opposite sides of said gate electrode.

16. An image sensor as defined in claim 13 wherein said insulating substrate comprises glass.

17. An image sensor as defined in claim 13 wherein said wiring film comprises chromium.

18. An image sensor as defined in claim 13, wherein said film including silicon comprises $Si_3N_4$.

19. An image sensor as defined in claim 13 wherein said second conductor comprises aluminum.

20. An image sensor as defined in claim 14 wherein said transparent electrode comprises indium tin oxide.

21. An image sensor as defined in claim 15 wherein said gate electrode comprises chromium.

22. An image sensor as defined in claim 15 wherein said gate insulating film comprises $Si_3N_4$.

23. An image sensor as defined in claim 15 wherein said active layer comprises undoped amorphous silicon.

24. An image sensor as defined in claim 15 wherein said ohmic contact layer comprises phosphorus doped $n^+$ type amorphous silicon.

25. An image sensor as defined in claim 15 wherein said transistor comprises a shading film of Al disposed opposite said gate for preventing light from entering said channel region.

26. A method of producing an image sensor in which an amorphous silicon photodiode and an amorphous silicon switching thin film transistor for reading out charges stored in said photodiode are integrated on the same insulating substrate comprising:

depositing a gate electrode of said transistor on a desired portion of an insulating substrate;

depositing a gate insulating film, an active layer, and an ohmic contact layer of said transistor successively on said insulating substrate;

etching and removing portions of said active layer and said ohmic contact layer other than the portions which constitute said transistor;

depositing a common wiring film as a source/drain electrode of said transistor and as a first electrode of said photodiode on the entire surface of said ohmic contact layer;

etching and removing portions of said ohmic contact layer and said common wiring film, which removed portions correspond to a channel region of said transistor;

depositing a channel protection film on the surface of said channel region;

depositing a shading film on said channel protection film for preventing light from entering said channel region;

depositing an amorphous silicon film constituting said photodiode on a desired portion of said common wiring film; and depositing a transparent electrode on said amorphous silicon film for guiding light into said amorphous silicon film.

27. The method of claim 26 wherein said gate insulating film, said active layer, and said ohmic contact layer are successively produced by an RF plasma CVD method.

28. The method of claim 26 wherein said common wiring film is deposited by a vacuum evaporation method.

29. The method of claim 26 wherein said amorphous silicon film constituting said photodiode is deposited by an RF plasma CVD method.

30. A method of producing an image sensor isn which an amorphous silicon photodiode, an amorphous silicon thin film transistor for reading out charges stored by said photodiode, and matrix wiring for taking out signals are integrated on a single insulating substrate comprising:

depositing a gate electrode of said transistor on a desired portion of an insulating substrate;

depositing a gate insulating film, an active layer, and an ohmic contact layer of said transistor successively on said insulating substrate;

etching and removing portions of said active layer and said ohmic contact layer other than the portions which constitute said transistor and which will be positioned under a source/drain electrode of said transistor;

depositing a common wiring film as a source/drain electrode of said transistor and as a first electrode of said photodiode on the entire surface of said ohmic contact layer;

etching and removing portions of said ohmic contact layer and said common wiring film, which removed portions correspond to a channel region of said transistor;

depositing a channel protection film on desired portions of said common wiring film for protecting said channel region and for insulating said source/drain electrode from a second conductor of said matrix wiring;

depositing a shading film for preventing light from entering said channel region;

depositing an undoped amorphous silicon film constituting said photodiode on a portion of said common wiring film; and depositing a transparent electrode on said amorphous silicon film for guiding light into said amorphous silicon film.

31. The method of claim 30 wherein said active layer and said ohmic contact layer are successively produced by an RF plasma CVD method.

32. The method of claim 30 wherein said common wiring film is deposited by a vacuum evaporation method.

33. The method of claim 30 wherein said undoped amorphous silicon film constituting said photodiode is deposited by an RF plasma CVD method.

* * * * *